(12) United States Patent
Sakai et al.

(10) Patent No.: US 8,057,017 B2
(45) Date of Patent: Nov. 15, 2011

(54) INK JET RECORDING HEAD WITH INK SUPPLY PORTS HAVING A CROSS-SECTION WITH VARYING WIDTH

(75) Inventors: Toshiyasu Sakai, Kawasaki (JP); Shuji Koyama, Kawasaki (JP); Kenji Ono, Tokyo (JP); Jun Yamamuro, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/878,339

(22) Filed: Sep. 9, 2010

(65) Prior Publication Data

US 2011/0102511 A1 May 5, 2011

Related U.S. Application Data

(62) Division of application No. 11/679,656, filed on Feb. 27, 2007, now Pat. No. 7,824,560.

(30) Foreign Application Priority Data

Mar. 7, 2006 (JP) .................. 2006-061166

(51) Int. Cl.
*B41J 2/05* (2006.01)
(52) U.S. Cl. ................. 347/65; 347/40; 347/63
(58) Field of Classification Search .......... 347/20, 347/40, 42, 43, 44, 47, 15, 56, 61–65, 67, 347/54
See application file for complete search history.

(56) References Cited

U.S. PATENT DOCUMENTS

| | | | |
|---|---|---|---|
| 5,760,803 A | 6/1998 | Yamamoto et al. | |
| 6,107,209 A | 8/2000 | Ohkuma | |
| 6,143,190 A | 11/2000 | Yagi et al. | |
| 6,397,466 B1 | 6/2002 | Koyama et al. | |
| 6,406,636 B1 | 6/2002 | Vaganov | |
| 6,422,686 B1 | 7/2002 | Ishinaga et al. | |
| 6,563,079 B1 | 5/2003 | Umetsu et al. | |
| 6,805,432 B1* | 10/2004 | Milligan et al. | 347/65 |
| 6,833,527 B2 | 12/2004 | Pollard | |
| 6,968,617 B2 | 11/2005 | Hostetler | |
| 7,198,353 B2* | 4/2007 | Hart et al. | 347/47 |
| 7,264,917 B2 | 9/2007 | Hu et al. | |
| 7,592,131 B2 | 9/2009 | Kubota et al. | |
| 2006/0032841 A1 | 2/2006 | Tan et al. | |
| 2006/0061626 A1 | 3/2006 | Saito et al. | |
| 2007/0212891 A1 | 9/2007 | Yamamuro et al. | |

FOREIGN PATENT DOCUMENTS

| | | |
|---|---|---|
| EP | 0885725 A2 | 12/1998 |
| EP | 0886307 A2 | 12/1998 |
| JP | 11-1000 A | 1/1999 |
| JP | 2001-10070 | 1/2001 |
| JP | 2003-53700 | 2/2003 |
| TW | 530007 | 5/2003 |
| TW | 580436 | 3/2004 |
| TW | 200410831 A | 7/2004 |

* cited by examiner

*Primary Examiner* — Juanita D Stephens
(74) *Attorney, Agent, or Firm* — Fitzpatrick, Cella, Harper & Scinto

(57) ABSTRACT

A manufacturing method for a substrate for an ink jet head, including formation of an ink supply port in a silicon substrate, the method includes a step of forming, on one side of the substrate, an etching mask layer having an opening at a position corresponding ink supply port; a step of forming unpenetrated holes through the opening of the etching mask layer in at least two rows in a longitudinal direction of the opening; and a step of forming the ink supply port by crystal anisotropic etching of the substrate in the opening.

3 Claims, 11 Drawing Sheets

INK JET RECORDING HEAD WITH INK SUPPLY PORTS HAVING A CROSS-SECTION WITH VARYING WIDTH

CROSS-REFERENCE TO RELATED APPLICATIONS

The present application is a divisional of U.S. patent application Ser. No. 11/679,656 filed Feb. 27, 2007, now U.S. Pat. No. 7,824,560, issued Nov. 2, 2010, the entire disclosure of which is incorporated by reference herein.

FIELD OF THE INVENTION AND RELATED ART

The present invention relates to a manufacturing method for an ink jet recording head chip recording on recording medium by jetting ink, and a manufacturing method for an ink jet recording head.

Ink jet heads of the type which jet ink upward of the elements for generating the ink jetting pressure have long been known (hereafter, this type of ink jet head may be referred to as side shooter head). This type of ink jet head is provided with a substrate, and an ink jetting energy generating portions which are on one of the primary surfaces of the substrate. The ink jetting energy generating portions are supplied with ink, from the back side, that is, the opposite surface of the substrate from the surface having the ink jetting energy generating portions, through the through holes.

One of the manufacturing methods for this type of ink jet head is disclosed in U.S. Pat. No. 6,143,190. More specifically, this patent discloses an ink jet head manufacturing method made up the following steps for preventing the formation of an ink jet recording head chip, the abovementioned through holes (common ink delivery channels) of which are nonuniform in diameter:
  (a) step for forming a sacrificial layer which can be etched across selected areas, on the areas of the surface of the substrate, which correspond to the positions of the through holes;
  (b) step for forming a passivation layer, which is resistant to etching, is formed in a manner to cover the sacrificial layer;
  (c) step for forming an etching mask layer having such holes that correspond in position to the strips of sacrificial layer on the back surface of the substrate;
  (d) step for anisotropically (with respect to crystal axes) etching the substrate through the openings until the strips of sacrificial layer are exposed;
  (e) step for etching away the strips of sacrificial layer, from the side exposed through the step for etching the substrate;
  (f) step for completing the through holes by removing the portions of the passivation layer, which correspond in position to the through holes.

Further, U.S. Pat. No. 6,107,209 discloses a method for anisotropically etching silicon (substrate formed of silicon), the surface azimuthal index of which is 100. This anisotropic etching method is characterized in that, before it etches a silicon substrate, it thermally processes the silicon substrate so that the cross section of each cavity (common ink delivery channel) which results from the etching, will be shaped like "< >".

Further, U.S. Pat. No. 6,805,432 discloses another manufacturing method for an ink jet recording head. According to this method, a silicon substrate is dry etched, with a mask placed on the back surface of the substrate, and then, the substrate is anisotropically etched utilizing the same mask. This manufacturing method can also effect common ink delivery channels, the cross sections of which are also shaped like "< >".

These manufacturing methods, which form cavities (common ink delivery channels) having the "< >"-shaped cross section, are advantageous in that they can manufacture an ink jet recording head, the substrate of which is substantially smaller, more specifically, substantially narrower, than an ink jet recording head manufactured using an ink jet recording head manufacturing method in accordance with the prior art. In the field of an ink jet recording head, in particular, the field of an ink jet recording apparatus which employs a multicolor recording head, the substrate of which is provided with multiple common ink delivery channels for delivering multiple inks, one for one, different in color, it is desired to manufacture an ink jet recording head chip, the substrate of which is even smaller than those of the ink jet recording head chips manufactured using the methods described above.

However, the method disclosed in U.S. Pat. No. 6,107,209 is limited in terms of the distance from the bottom surface of a substrate to the apex of the "< >"-shaped cross section of the common ink delivery channel. Further, when this method is used, the cross-sectional shape, in which each common ink delivery channel will be finished, is affected by the oxygen concentration of the silicon substrate, making it difficult to reliably (accurately) mass-produce ink jet recording head chips.

On the other hand, in the method disclosed in U.S. Pat. No. 6,805,432, the mask used for dry etching is also used for wet etching. Thus, when this method is used, the width of the common ink delivery channel is determined by the width of the opening of the hole of the mask on the back surface of a substrate, and the depth by which the substrate is dry etched. Therefore, in order to form a common ink delivery channel, the opening of which is narrow, that is, a so-called narrow common ink delivery channel, it is necessary to increase the depth to which the substrate is dry etched. Therefore, this method is problematic in that it is inferior in terms of manufacture efficiency, because it takes more time to make a hole in a silicon substrate by dry etching than by wet etching.

SUMMARY OF THE INVENTION

Thus, the primary object of the present invention is to provide an ink jet recording head chip manufacturing method for more reliably mass-producing ink jet recording head chips, at a higher level of accuracy than an ink jet recording head chip manufacturing method in accordance with the prior art. More specifically, the primary object of the present invention is to manufacture an ink jet recording head chip, the common ink delivery channels of which are substantially narrower than that of an ink jet recording head chip manufactured with the use of the ink jet recording head chip manufacturing method in accordance with the prior art, at a substantially higher level of precision and in a substantially shorter length of time, compared to the method in accordance with the prior art.

According to an aspect of the present invention, there is provided a manufacturing method for a substrate for an ink jet head, including formation of an ink supply port in a silicon substrate, said method comprising a step of forming, on one side of said substrate, an etching mask layer having an opening at a position corresponding ink supply port; a step of forming unpenetrated holes through said opening of said etching mask layer in at least two rows in a longitudinal direction of said opening; and a step of forming said ink supply port by crystal anisotropic etching of said substrate in said opening.

The present invention makes it possible to reliably mass-manufacture ink jet recording head chips, at a substantially higher level of efficiency.

These and other objects, features, and advantages of the present invention will become more apparent upon consideration of the following description of the preferred embodiments of the present invention, taken in conjunction with the accompanying drawings.

DETAILED DESCRIPTION OF THE PREFERRED EMBODIMENTS

The preferred embodiments of the present invention will be described with reference to the appended drawings.

The characteristic feature of the present invention which relates to the method for processing the substrate for an ink jet recording head chip is that the substrate is anisotropically etched after blind pilot holes for forming the common ink delivery channels (which hereafter will be referred to simply as pilot holes) are formed by a laser. This feature will be described in detail in the following preferred embodiments of the present invention.

Embodiment 1

Figure 1:
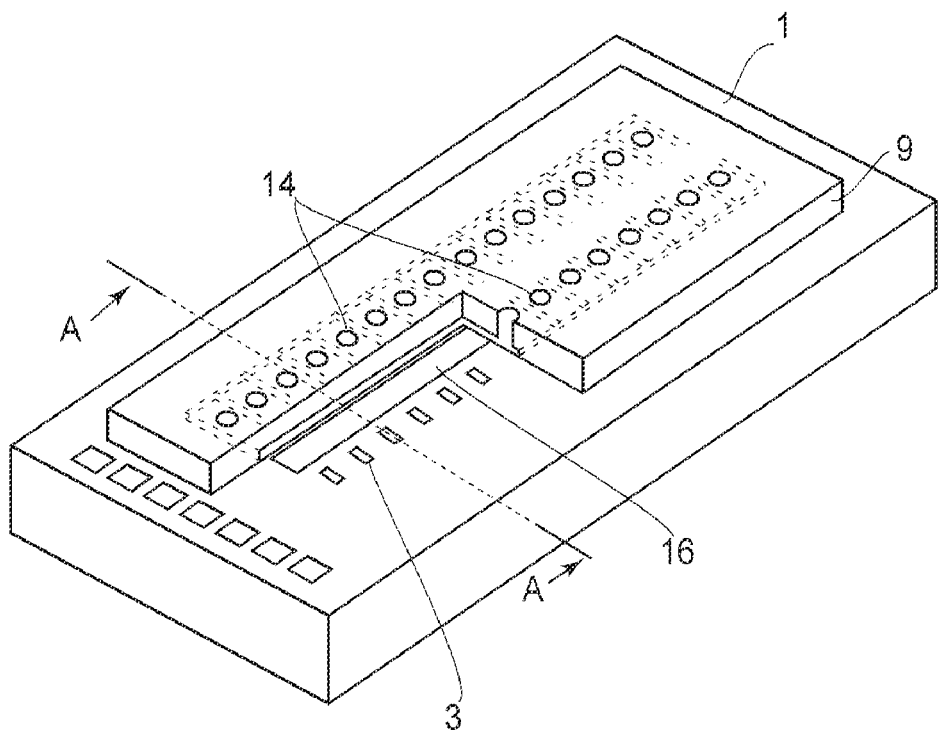
FIG. 1 is a perspective view of a part of an ink jet recording head chip in one of the preferred embodiments of the present invention.

FIG. 1 shows a part of the ink jet recording head in this embodiment of the present invention.

This ink jet recording head (liquid jetting head) has a silicon substrate 1, which has two rows of elements 3 for generating ink (liquid) jetting energy (which hereafter may be referred to simply as energy generation elements). In each row, the energy generation elements are aligned with a preset pitch. The silicon substrate 1 is covered with a layer of polyether-amide (unshown) as an adhesion enhancement layer. Also located on the silicon substrate 1 (adhesion enhancement layer) are a photosensitive resin layer 9, which is the layer through which ink jetting holes 14 (liquid jetting hole) are formed. The ink jet holes 14 are located above the energy generation elements 3, one for one. This photosensitive layer 9 also serves as the top wall of each ink passage which leads from the common ink delivery channel 16 (liquid delivery hole) to ink jetting hole 14. In terms of the direction perpendicular to the abovementioned two rows of energy generation elements 3, the common ink delivery channel 16 (liquid delivery hole) formed by anisotropically etching the silicon substrate 1 is between the two rows of energy generation elements 3. As the energy generated by each of the selected generation elements 3 is applied to the body of ink in the corresponding ink passage supplied from the common ink delivery channel 16, the ink is jetted out in the form of a droplet (droplets) from the corresponding ink jetting hole 14, and adhere to recording medium, effecting thereby an image on recording medium.

This ink jet recording head is usable with various recording apparatuses, for example, a printer, a copying machine, a facsimile machine having a communication system, a word-processor having a printing portion, an industrial recording apparatus comprising a printer portion and various processing apparatuses, etc., which employ an ink jet recording head (ink jet recording heads). This ink jet recording head can record on various recording media, for example, paper, yarn, fiber, leather, metal, plastic glass, lumber, ceramic, etc. "Recording" in the following description of the present invention means not only adherently depositing an image, such as a letter or a specific shape, which has a meaning, on recording medium, but also, adherently depositing a meaningless pattern on recording medium.

(Characteristic Features of Anisotropic Etching Method which Uses Pilot Holes)

According to the manufacturing method in this embodiment, the substrate is anisotropically etched after pilot holes 20 are formed in a preset pattern and to a preset depth by a laser. Therefore, this manufacturing method is more reliable as the method for forming the common ink delivery channel 16, the cross-section of which is "< >"-shaped. This method also makes it easier to form the common ink delivery channel 16, the cross section of which is "< >"-shaped. That the common ink delivery channel 16 is "< >"-shaped means that, in terms of the width direction of the substrate, the width of the common ink delivery channel 16 gradually increases, starting from its opening at the back surface of the substrate 1 toward a preset depth of the substrate 1, being largest at this depth, and then, gradually reduces toward its opening at the front surface of the substrate 1. That is, in terms of the cross-sectional view of the common ink delivery channel 16, the abovementioned preset depth corresponds to the apex (peak) of the cross section of the common ink delivery channel 16.

Figure 2:
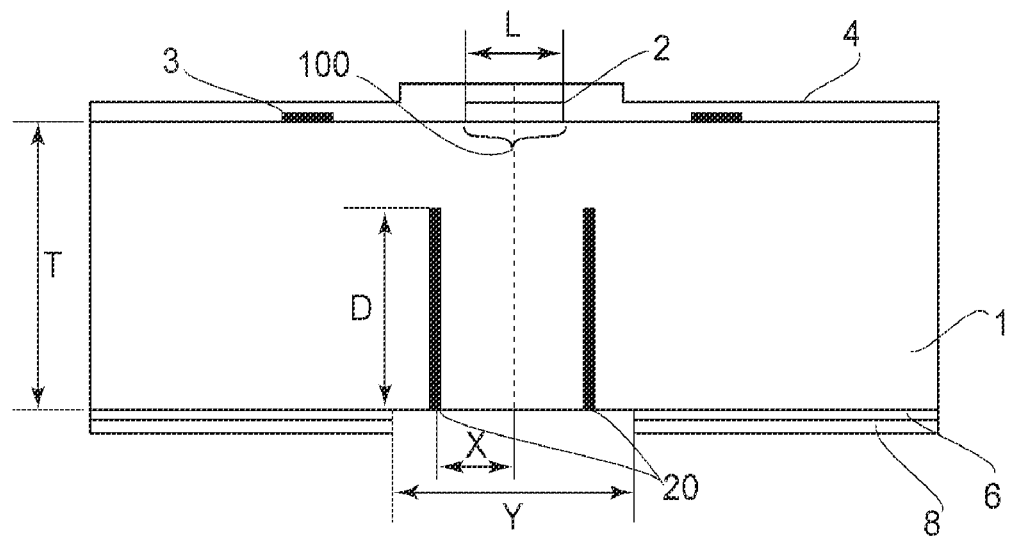
FIG. 2 is a sectional view of the precursor of a typical ink jet recording head chip, to which the ink jet recording head chip manufacturing method in the first embodiment of the present invention is applicable.

FIG. 2 is a sectional view of the precursor of the ink jet recording head chip, with which the manufacturing method in this embodiment is compatible. FIG. 2 shows the cross section of the ink jet recording head chip, at a plane which coincides with a line A-A in FIG. 1 and is perpendicular to the substrate. Referring to FIG. 2, designated by a reference numeral 2 is a sacrificial layer, and designated by a reference numeral 4 is an etching stop layer (passivation layer). Designated by a reference numeral 1 is a substrate portion of the ink jet recording head chip, which is formed of silicon (hereinafter, this portion may be referred to simply as substrate 1), and designated by a reference numeral 8 is a mask formed on the back surface of the silicon substrate 1 to anisotropically etch the silicon substrate 1 from the back side. Designated by a reference numeral 20 is a pilot hole. The sacrificial layer 2 is provided in an area 100 which is going to be formed with the ink delivery channel in the silicon substrate surface. The sacrificial layer 2 is effective in order to precisely define the area of the ink delivery channel, but it is not inevitable in the present invention. The etching stop layer (passivation layer) is made of a material having resistance properties against the material of the anisotropic etching. The etching stop layer 4 functions as a partition wall or the like in the case that the surface of the silicon substrate is formed with elements and/or structures such as portions constituting the ink passage. When the sacrificial layer 2 and the etching stop layer 4 are used alone or in combination, it will suffice if it or they are formed on the silicon substrate prior to the etching. In the step before the etching, the order of formations and the timing thereof are not limited to specific nature, but may be as known by one skilled in the art. In this embodiment, at least two rows of pilot holes 20 are formed per common ink delivery channel 16, in terms of the width direction of the common ink delivery channel 16, in a back side of the ink jet head substrate, as will be evident from FIG. 2. It is preferable that the pilot holes 20 are formed in two straight rows which are symmetrically positioned with reference to the center line (parallel to lengthwise direction of common ink delivery channel) of the common ink delivery channel 16, in terms of the width direction (which is perpendicular to surface of paper on which FIG. 2 is drawn) of the common ink delivery channel 16 (FIG. 5). Incidentally, in this disclosed embodiment, the pilot holes 20 are formed in two straight rows.

Figure 3:
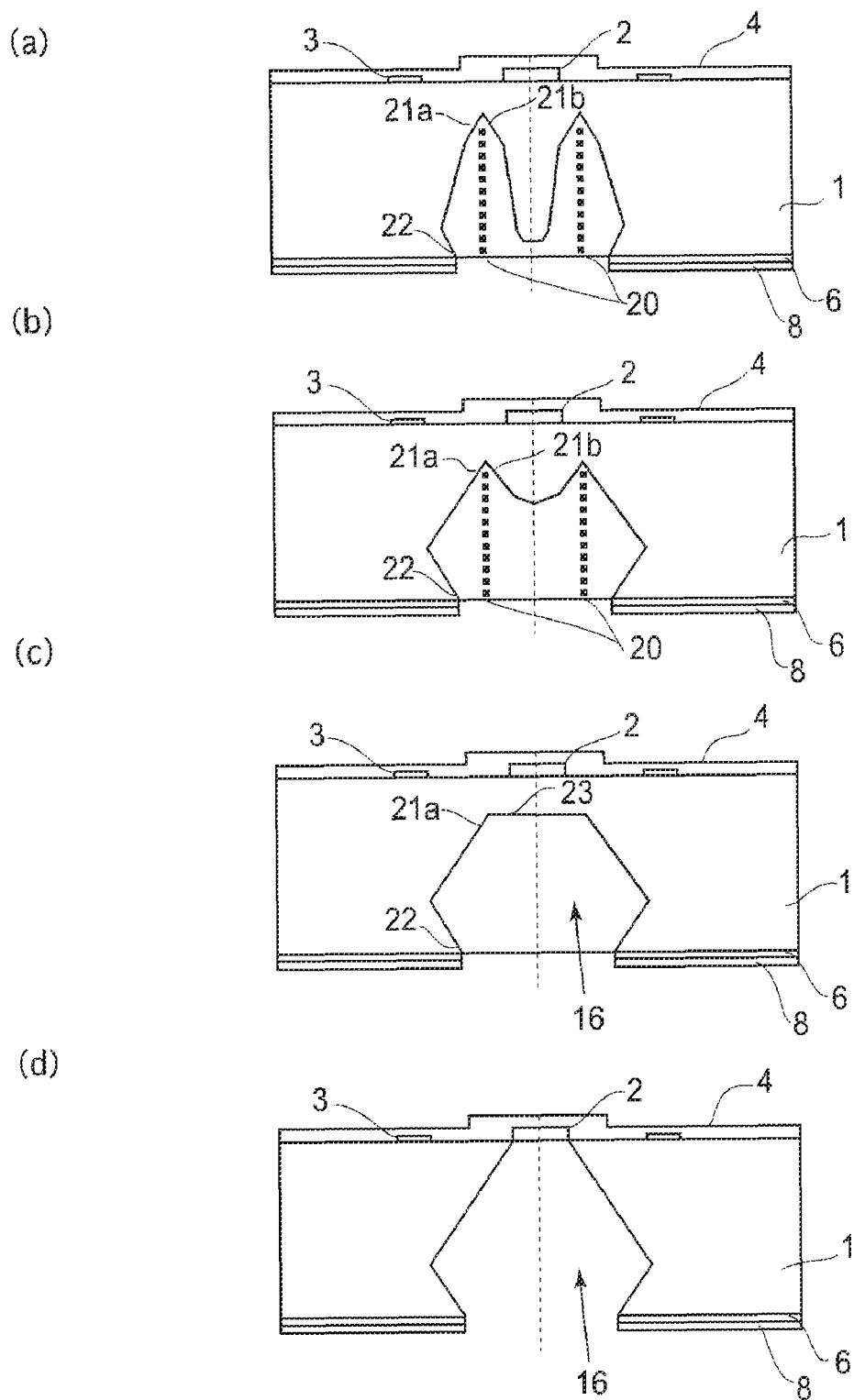
FIG. 3 is a sectional drawings showing Steps (A)-(D) in the ink jet recording head chip manufacturing method, which is in the first embodiment of the present invention.

FIG. 3 schematically shows the sequential steps in the process for anisotropically etching the silicon substrate 1 which has the pilot holes 20 formed in advance, as shown in FIG. 2. In the following examples, the use is made with a sacrificial layer 2 and a passivation layer 4.

First, the substrate 1 is etched from its back side (bottom side). Thus, not only does the etching start at the deepest end of each pilot hole 20 and progress toward the top surface of the substrate 1, but also, the etching starts across the entirety of the internal surface of the pilot hole 20 and progresses in the direction (left-and-right direction of drawing) perpendicular to the thickness direction of the substrate 1. As a result, each pilot hole 20 grows into a cavity (precursor of common ink delivery channel), the top portion of which has <111>surfaces 21a and 21b, which are slanted so that the width of the cavity gradually reduces toward the top surface, and the bottom portion of which has a <111>surface 22, which is slanted so that the width of the cavity gradually increases toward the top surface (FIG. 3(a)).

As the etching progresses further, the <111>surface 21b of one of the pilot holes 20 comes into contact with the <111>surface 21b of the other pilot hole 20, effecting an apex, and then, the etching begins to progress from this apex toward the top surface of the substrate 1. Further, the <111>surface 21a, or the outward surface, with reference to the center of the substrate 1, intersects with the <111>surface 22, which extends from the bottom surface of the substrate 1. As a result, the apparent growth of the cavity in the direction perpendicular to the thickness direction of the substrate 1 stops (FIG. 3(d)). It is added that the etching can be finished without the sacrificial layer.

As the etching progresses further, a <100> surface 23 is formed between the two pilot holes 20 (FIG. 3(c)). The progression of the etching process causes this <100>surface 23 to shift toward the top surface of the substrate 1. Eventually, the <100> surface 23 reaches the sacrificial layer 2, when the anisotropic etching is ended (FIG. 3(d)).

In the method, such as the above described one, for forming the common ink delivery channel 16, the final position of each <111>surface 21a which is inclined so that the width of the common ink delivery channel 16 gradually reduces toward the top surface of the substrate 1, is determined by the position of the pilot hole 20. Further, the final position of the <111>surface 22 which grows from the bottom surface of the bottom surface of the substrate 1 is determined by the position of each of the holes of the mask 8 which is placed on the bottom surface of the substrate 1.

Figure 4:
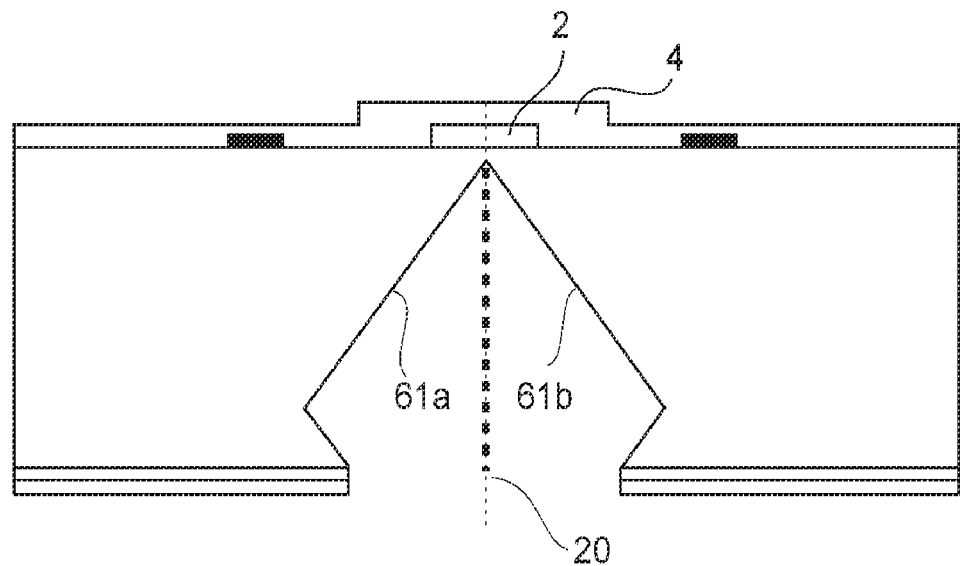
FIG. 4 is a sectional view of an ink jet recording head chip, which has only a single row of pilot holes for forming a common ink delivery channel, which is parallel to the lengthwise direction of the common ink delivery channel.

FIG. 4 is a sectional view of the precursor of an ink jet recording head chip, the substrate of which had only a single row of the pilot holes 20, which was parallel to the lengthwise direction of the common ink delivery channel 16. In the case of the precursor shown in FIG. 4, the apparent progression of the anisotropic etching process sometimes stops at the apex which is formed by two <111>surfaces 61a and 61b and corresponds in position to the inward end of the pilot hole 20, and therefore, it is difficult to expose the sacrificial layer 2 from the bottom side of the substrate 1. Moreover, if an attempt is made to form a pilot hole (20) long enough to reach the sacrificial layer 2, it is possible that the beam of laser light might penetrate the sacrificial layer 2 and etching stopping layer 4. Further, if there are functional layers, such as a wiring layer, which were formed in advance, on the top surface of the substrate 1, the beam of laser light may damage the functional layers after penetrating these two layers 2 and 4. Moreover, if there are ink passages, which were formed in advance, on the top surface of the substrate 1, it is possible that the beam of laser light will damage the ink passages. Therefore, it is difficult to precisely form the common ink delivery channel 16 which has the desired shape and dimension, by forming only a single row of pilot holes 20.

Referring again to FIG. 2, a character L stands for the width of the sacrificial layer 2 (distance between two ends of closest surface of sacrificial layer 2 to bottom surface of silicon substrate 1), and a character T stands for the thickness of the silicon substrate 1. A character X stands for the distance from the center of the sacrificial layer 2 to the center of the adjacent pilot hole 20, and a character D stands for the depth of the pilot hole 20. Further, a character Y stands for the width of the opening of the hole in the bottom surface mask 8. In an example using the sacrificial layer 2, the sacrificial layer 2 is provided in the area which is to be bored for the ink delivery channel in the silicon substrate surface, and therefore, the centers and ends of the sacrificial layer 2 and the area are aligned with each other.

In order to expose the sacrificial layer 2 by anisotropically etching the substrate 1 from the bottom side of the substrate 1 during the above described progression of the ink jet head manufacturing process, the depth D of each pilot hole 20 is desired to fall within the following range which satisfies the following expression:

$$T-(X-L/2)\times\tan 54.7° \geqq D \geqq T-X\times\tan 54.7°  \quad (1).$$

Further, in order to form the common ink delivery channel 16 described above, the cross section of which is "< >"-shaped, the width Y of the opening of the hole in the bottom surface mask 8 is desired to satisfy the following expression:

$$(T/\tan 54.7°)\times 2+L \geqq Y  \quad (2).$$

On the other hand, if the width Y of the opening of the hole in the bottom surface mask 8 is greater than (T/tan 54.7°)×2+ L, a common ink delivery channel, which has only two <111>surfaces (lateral surfaces), the distance between which is greatest at the bottom of the silicon substrate 1 and gradually decreases toward the top surface of the substrate 1, is formed.

As described above, the manufacturing method, in this embodiment, for an ink jet recording head chip makes it possible to form various kinds of common ink delivery channels (16), which are different in terms of the shape of their cross sections, by changing the pattern in which the pilot holes 20 are arranged, the depth of each pilot hole 20, and/or the width of the opening of the hole of the bottom surface mask 8, as necessary. That is, not only can the ink jet recording head chip manufacturing method in this embodiment make it possible to form a common ink delivery channel (16), which is relatively wide at the bottom surface of the substrate 1, and the apex of each side wall of which is located close to the bottom surface of the substrate 1, but also, a common ink delivery channel (16), which is relatively narrow at the bottom surface of the substrate 1, and the apex of each side wall of which is located close to the middle of the substrate 1 in terms of the thickness direction of the substrate 1.

In the manufacturing method, in this embodiment, for the ink jet recording head chip, the pilot holes 20 for forming the common ink delivery channel 16 with the "< >"-shaped cross section are formed with the use of a laser. The usage of a laser makes it possible to precisely process preset points (portions) of the substrate 1 at a high speed. Further, it does not require the substrate 1 to be processed (for example, it does not require mask or the like to be formed on substrate 1) before it is processed by a laser. Therefore, it makes it possible to reduce the number of steps necessary for forming the common ink delivery channel 16, the cross section of which is "< >"-shaped.

Further, the liquid etchant enters the pilot holes 20 in the substrate 1, reducing thereby the length of time necessary for forming the common ink delivery channel 16, compared to an ink jet recording head chip manufacturing method which does not form pilot holes for the common ink delivery channels.

Regarding the step for forming the pilot holes 20, changing the conditions under which the pilot holes 20 are formed, based on the thickness of the silicon substrate, which was measured in advance, makes it possible to more reliably form the common ink delivery channels 16.

Normally, silicon wafers used as the material for the substrate 1 for the ink jet recording head chip are not the same in thickness; they vary in thickness within a range of roughly 30-50 µm. That is, the thickness T (in Expression (1)) of the silicon substrate 1 (silicon wafer) varies in the range of 30-50 µm, which reduces the range of D, reducing thereby the margin for this step. However, by measuring in advance the thickness of the silicon substrate 1 (silicon wafer), it is possible to reduce the apparent effects of the deviation in the thickness T of the silicon substrate 1 (silicon wafer).

(Method for Feeding Back Measured Thickness of Substrate (Silicon Wafer))

Figure 13:
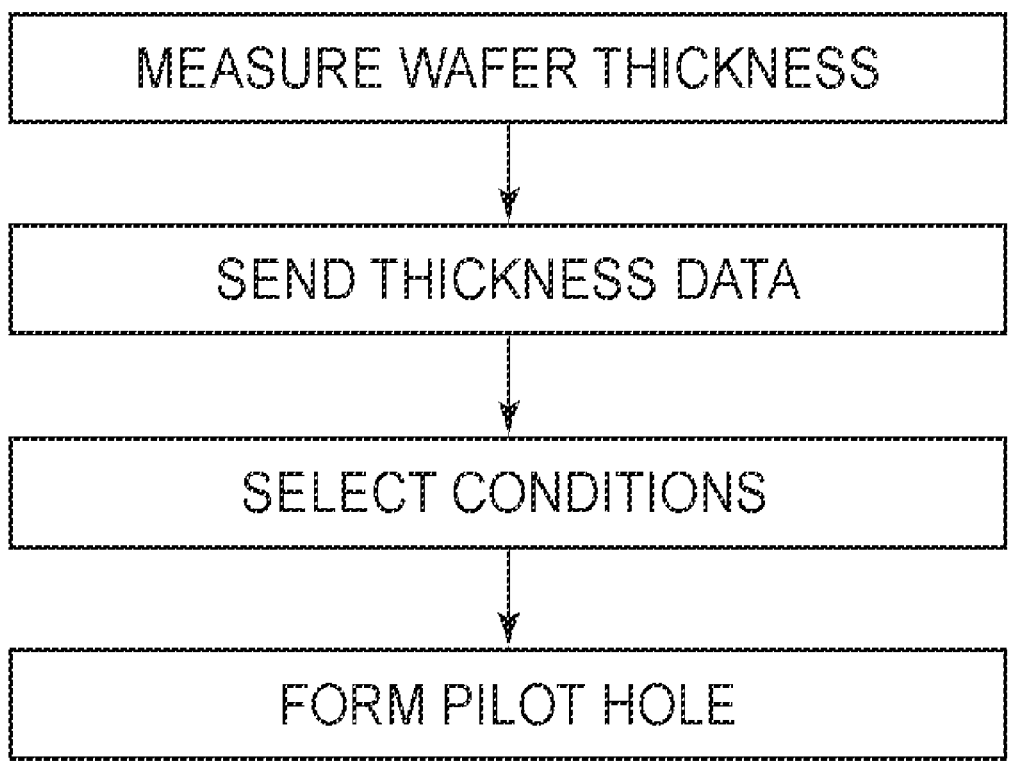
FIG. 13 shows the sequence for forming the pilot holes.

FIG. 13 shows the sequence for forming the pilot holes. First, the thickness of the substrate 1 (silicon wafer) is measured with the use of a silicon substrate (wafer) thickness measuring device. Then, based on the measured thickness of the substrate 1 (silicon wafer), the optimal conditions for processing the substrate 1 (silicon wafer) with the use of a laser-based processing apparatus are selected. Then, the pilot holes 20 are formed with the laser-based processing apparatus, under the selected (optimal) conditions.

Once the nozzle formation layer is formed on the top surface of the substrate 1 (silicon wafer), it is impossible to directly measure the thickness of the substrate 1 (silicon wafer) with the use of an ordinary thickness measuring device, that is, a silicon substrate (wafer) thickness measuring device of the reflection type. Therefore, when a silicon substrate (wafer) thickness measuring device of the reflection type is used for measuring the thickness of the substrate 1 (silicon wafer), the thickness must be measured before the nozzle formation layer is formed (this process will be described later, referring to FIG. 5a, (a)). There are various manufacturing steps between the measurement of the thickness of the substrate 1 (silicon wafer) and the formation of the pilot holes 20, making it difficult to match the values obtained by measuring the thicknesses of a substantial number of substrates 1 (silicon wafers), with the corresponding substrates 1 (silicon wafer). Therefore, it is desired to provide a laser-based processing apparatus with a function of identifying (reading) the identification number of each substrate (silicon wafer) so that the optimal conditions for the formation of the pilot holes 20 can be selected for the substrate 1 (silicon wafer), after it is confirmed that a specific value among many values obtained by measuring the thicknesses of a substantial number of substrates 1 (silicon wafers) matches the substrate 1 (silicon wafer) which is going to be used next as the material for the manufacturing of the ink jet recording head chip.

On the other hand, when a silicon substrate (wafer) thickness measuring device which uses near infrared rays is used as the device for measuring the thickness of the substrate 1 (silicon wafer), the thickness of the substrate 1 (silicon wafer) can be directly measured even if there is a nozzle formation layer on the top surface of the substrate 1 (silicon wafer). That is, in this case, the thickness of the substrate 1 (silicon wafer) can be measured after the formation of the nozzle formation layer (this process will be described later, referring to FIG. 5b, (f)). Thus, it is possible to place a silicon wafer thickness measuring device which uses near infrared rays, in a laser-based processing apparatus so that the thickness of the substrate 1 (silicon wafer) can be measured immediately before the formation of the pilot holes 20.

(Method for Changing Conditions)

The conditions for processing the substrate 1 with the use of a laser to form the pilot holes 20 are to be changed, as necessary, based on the thickness of the substrate 1 (silicon wafer) measured as described above. The conditions which are changeable are the following two.

One is the depth D of each pilot hole 20 (which is to be changed based on the thickness of the substrate 1. If the thickness of the substrate 1 is greater than the normal one, the depth D of the pilot hole 20 is to be increased, whereas the thickness of the substrate 1 is less than the normal one, the depth of the pilot hole 20 is to be reduced. The depth D can be changed by adjusting laser output, and/or laser shot count.

The other condition is the distance X, or the distance between the centers of the area to be bored for the ink delivery channel in the substrate surface (the sacrificial layer 2 when the sacrificial layer is provided) and pilot hole 20 (which is to be changed based on thickness of substrate 1). If the thickness of the substrate 1 is greater than the normal one, the distance X is to be increased, whereas the thickness of the substrate 1 is less than the normal one, the distance X is to be reduced. By changing the distance X, the ink jet recording head chips which will be yielded from one silicon wafer can be made the same as those from another silicon wafer, in terms of the width of the top opening of the common ink delivery channel 16 (width of top end of cavity when cavity grown to sacrificial layer).

Figure 5A:
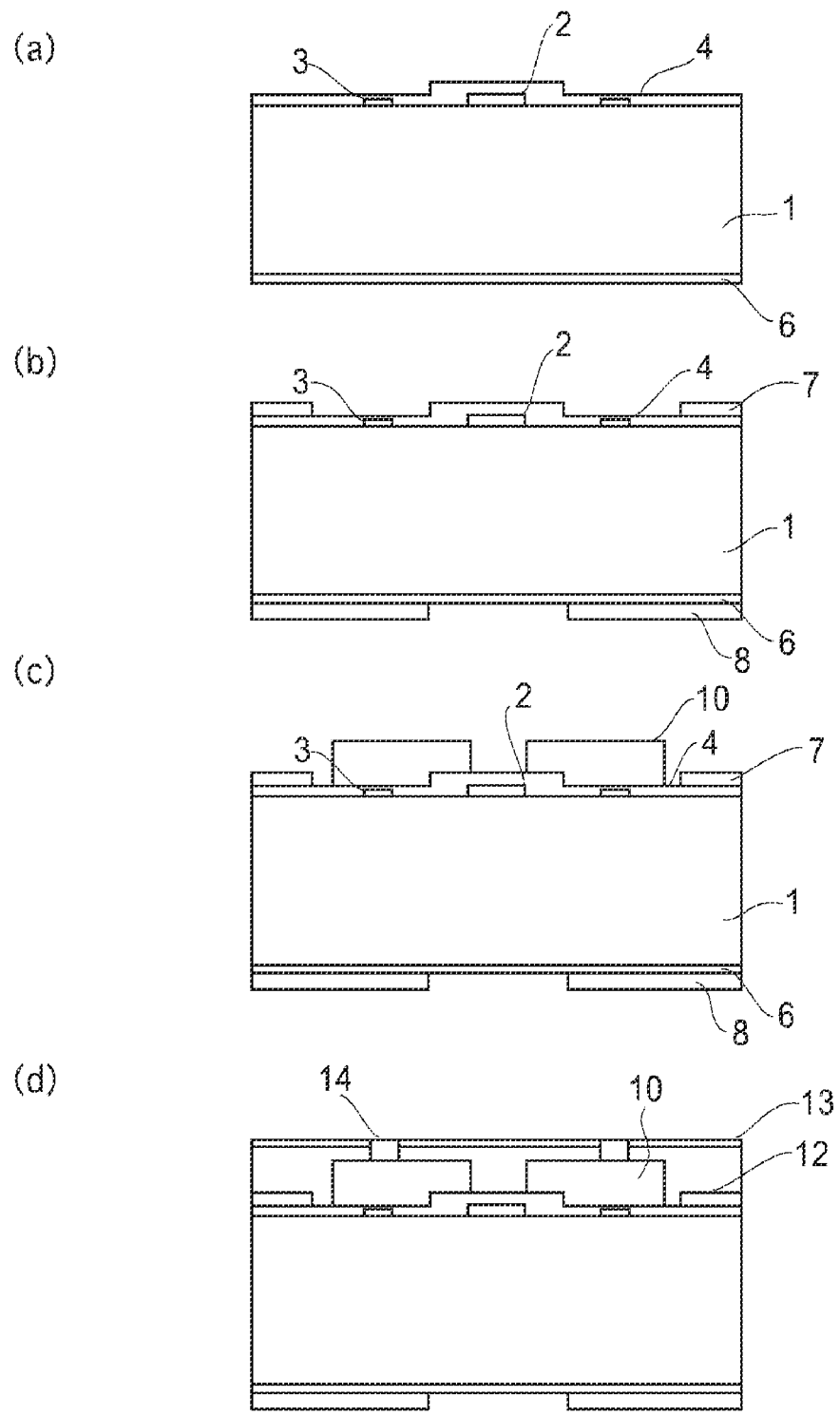
FIG. 5a is a sectional drawing showing Steps (a)-(d) in the ink jet recording head chip manufacturing method in the first embodiment, which includes Steps (a)-(d) shown in FIG. 3.
Figure 5B:
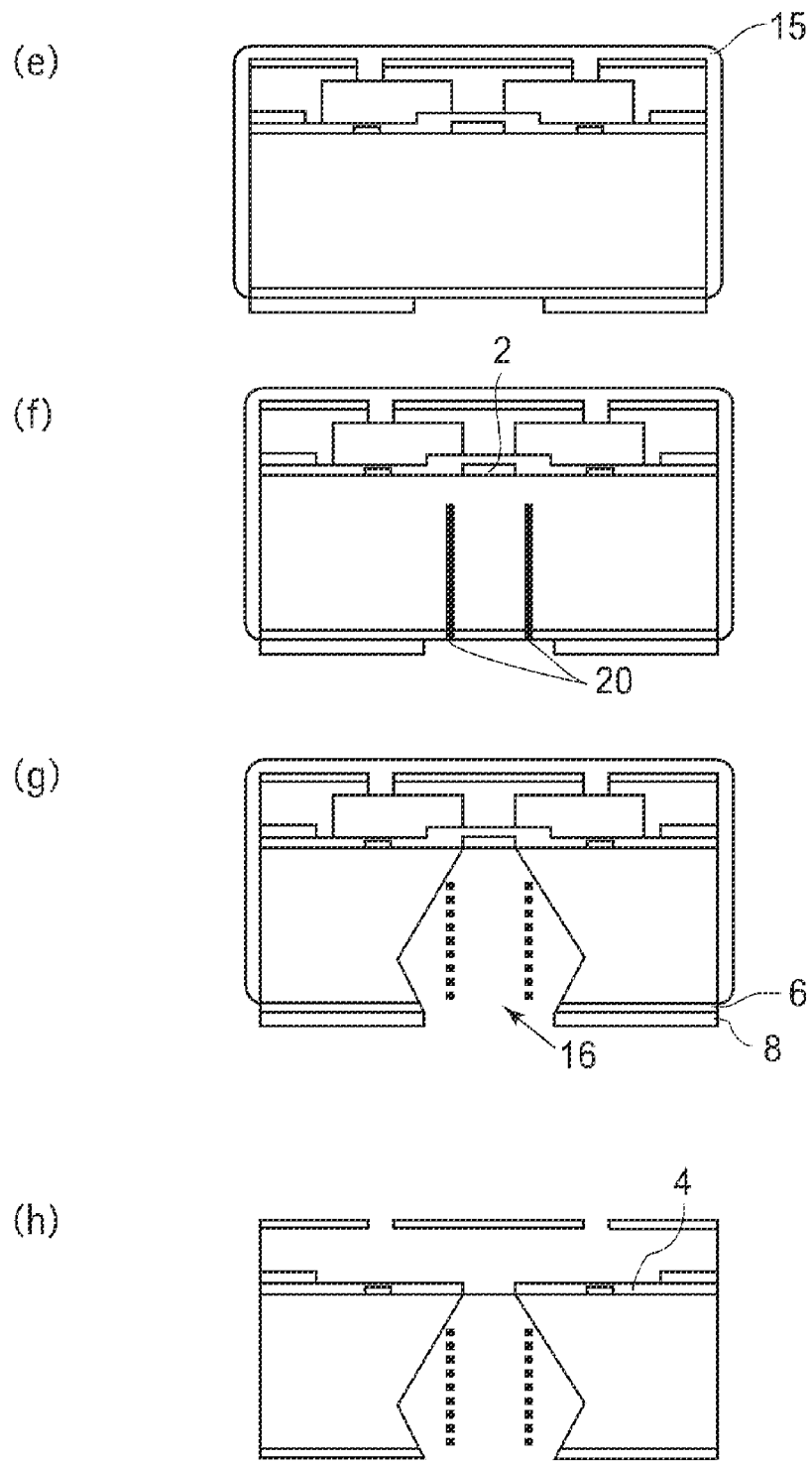
FIG. 5b is a sectional drawing showing Steps (e)-(h) in the ink jet head manufacturing method in the first embodiment, which includes Steps (a)-(d) shown in FIG. 3.

Referring to FIGS. 5A and 5B, the process for manufacturing an ink jet recording head using the above described ink jet recording head chip manufacturing method will be described. Incidentally, the preferred embodiments of the present invention, which were described so far and will be described hereafter, are not intended to limit the present invention in scope. That is, the present invention is also applicable to other technologies which are compatible with the gist of the present invention stated in the claim section of this application.

FIGS. 5A(A)-5A(D) and 5B(E)-5B(H) are sectional views of the ink jet recording head chip in the various stages completion, at a line A-A in FIG. 1.

On the top surface of the substrate 1 shown in FIG. 5a, (a), there are multiple ink jetting energy generation elements 3, such as heat generating resistors, for generating the energy for jetting ink. The entirety of the bottom surface of the substrate 1 is covered with a silicon dioxide film 6. Also the sacrificial layer 2 is provided on the top surface of the substrate 1. The sacrificial layer 2 is dissolved away with alkaline solvent when forming the common ink delivery channel 16. The wiring for the energy generation elements 3 and the semiconductors for driving the heaters (energy generating elements 3) are not shown. The sacrificial layer 2 is formed of such a substance as polysilicon, aluminum (which can be quickly etched), aluminum-silicon, aluminum-copper, and aluminum-silicon-copper, which can be etched with alkaline solvent, although the selection does not need to be limited to these examples. That is, any substance which is greater in the speed at which it can be etched with alkaline solvent, than silicon may be selected. The etching stop layer 4 must be capable of preventing the substrate 1 from being further etched by alkaline solvent, once the sacrificial layer 2 is exposed during the anisotropic etching of the substrate 1. It is preferred that the etching stop layer 4 is formed of silicon dioxide, which is also used as the material for the heat storage layer placed on the bottom side of the heater 3, silicon nitride, which is also used as the material for the protective layer placed on the energy generating element 3, or the like.

Referring to FIG. 5a, (b), polyether-amide resins (7) and (8) are coated on the top and bottom surfaces of the substrate 1, respectively, and are hardened by baking. Then, in order to pattern the polyether-amide resin layer 7, the positive resist (unshown) is spin coated on the top surface of the resin layer 7, is exposed in a preset pattern, and is developed. Then, the polyether-amide resin layer 7 is etched in the preset pattern by dry etching or the like method. Then, the positive resist is removed. Similarly, in order to pattern the polyether-amide resin layer 8, positive resist (unshown) is coated on the polyether-amide resin layer 8 on the bottom surface of the substrate 1, is exposed in a preset pattern, and is developed. Then, the polyether-amide resin layer 8 is etched or the like method in the preset pattern. Then, the positive resist is removed.

Referring to FIG. 5a, (c), positive resist 10 which is to be removed to form an ink passage is placed in the pattern of the ink passage.

Referring to FIG. 5a, (d), photosensitive resin as the material for forming nozzles is coated by spin coating or the like method on the top side of the substrate 1 in a manner to cover the positive resist 10. Then, a water repellant dry film 13 is placed on the photosensitive resin layer 12 by lamination or the like method. Then, the photosensitive resin layer 12 is patterned. That is, it is exposed in a preset pattern, with the use of ultraviolet rays, deep ultraviolet rays, or the like, and is developed, forming an ink jetting hole 14 through the photosensitive resin layer 12.

Referring to FIG. 5b, (e), the top side of the substrate 1, on which the positive resist 10, photosensitive resin layer 12, etc., are present, and the lateral sides of the substrate 1, are coated with a protective layer 15 by spin coating or the like method.

Referring to FIG. 5b, (f), the pilot holes 20 are formed with the use of a laser, from the bottom side of the substrate 1 toward the top side. In this step, two straight rows of pilot holes 20 are formed per common ink delivery channel 16 so that the two rows are symmetrically positioned with reference to the center of the sacrificial layer 2. As the means for forming the pilot holes 20, a beam of frequency-tripled (THG: 355 nm in wavelength) laser light emitted by a YAG laser is used. The power and frequency of the laser was set to optimum values. In this embodiment, the diameter of the pilot hole 20 is roughly 40 μm. The diameter of the pilot hole 20 is desired to be in a range of roughly 5-100 μm. If it is excessively small, it is difficult for the etchant to enter the pilot hole 20 during the subsequent step in which the substrate 1 is anisotropically etched. On the other hand, if the diameter of the pilot hole 20 is excessively large, it takes an excessive length of time to form the pilot hole 20 with the preset depth. Incidentally, if it is necessary to increase the diameter of the pilot hole 20, the pitch with which the pilot holes 20 are formed must be set so that the adjacent two pilot holes 20 do not overlap.

Figure 6:
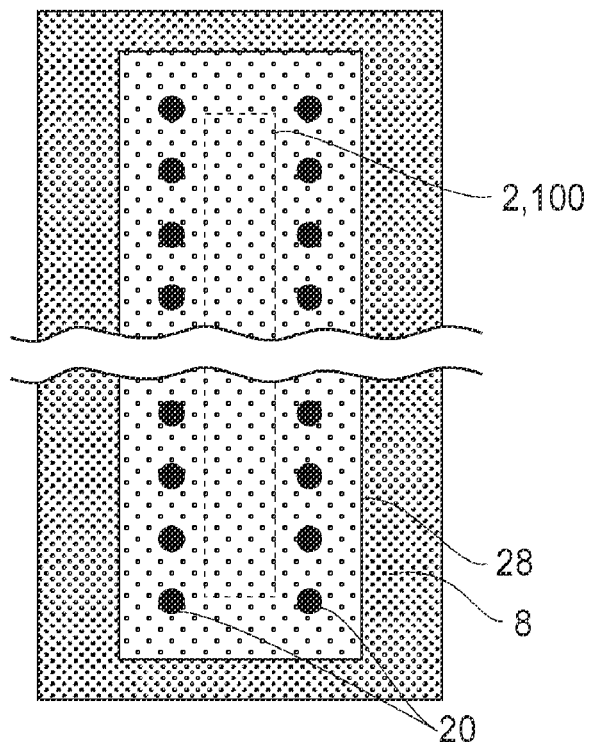
FIG. 6 is a plan view of the back side of the substrate immediately after the formation of the pilot holes in Step (f) shown in FIG. 5b.

FIG. 6 is a plan view of the bottom side of the substrate 1 after the formation of the pilot holes 20 in the step shown in FIG. 5b, (f). The polyether-amide layer 8 (bottom surface mask) on the bottom surface of the substrate 1 has holes 28, the positions of which correspond to those of the strips of sacrificial layer 2 (contoured by dotted line in FIG. 6), one for one, on the top surface of the substrate 1. These hole 28 are formed in the step shown in FIG. 5a, (b), and the polyether-amide resin layer 8 functions as the mask used for anisotropically etching the substrate 1. The thickness of the substrate 1 (silicon wafer) measured at this point in the manufacturing process, with the use of the abovementioned silicon wafer thickness measuring device which uses near infrared rays was 600 μm. The dimension of the sacrificial layer 2 in terms of its width direction was 150 μm. The pitch of the multiple common ink delivery channels 16 was 1,500 μm. The distance X, or the distance between the centers of the sacrificial layer 2 and pilot hole 20, in terms of the width direction of the substrate 1, was set to 100 μm. Then, the pilot holes 20 were formed, with the number of pulses of laser light set according to these measurements, and the Expression (1), so that the depth of the pilot holes 20 will be in a range of 490-530 μm. The pilot holes 20 were formed in the portions of the substrate, which corresponds in position to the holes 28. In terms of the width direction of the substrate 1, the pitch of the holes 28 was set to 200 µm, and in terms of the lengthwise direction of the substrate 1, the pitch of the holes 28 was set to 100 µm.

In this embodiment, the dimension of the hole 28 in the width direction of the substrate 1 is 400 µm. The width of the sacrificial layer 2 in the width direction of the substrate 1 is 150 µm. The depths of the pilot holes 20 measured, in terms of vertical cross section, after the forming of the pilot holes 20 using a laser was in a range of 420-460 µm. The thickness of the substrate 1 measured with the use of the abovementioned silicon wafer thickness measuring device which uses near infrared rays at this point in the manufacturing process was 600 µm. Thus, from these measurements and Expression (1), the distance X, or the distance between the centers of the sacrificial layer 2 and pilot hole 20, was set to 150 µm. Then, the pilot holes 20 were formed. That is, multiple pilot holes 20 were formed so that their pitch in terms of the width direction of the hole 28 was 300 µm, and their pitch in terms of the lengthwise direction of the hole 28 was 150 µm.

Figure 14:
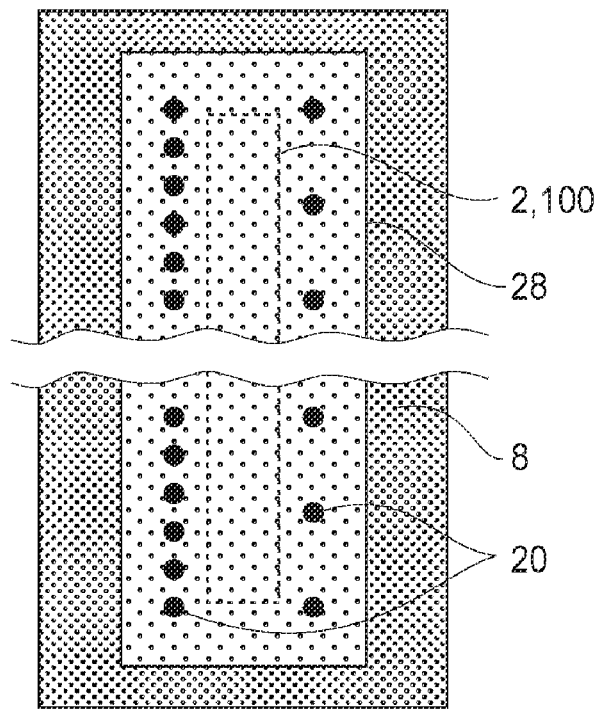
FIG. 14 shows another example of a pilot hole.
Figure 15:
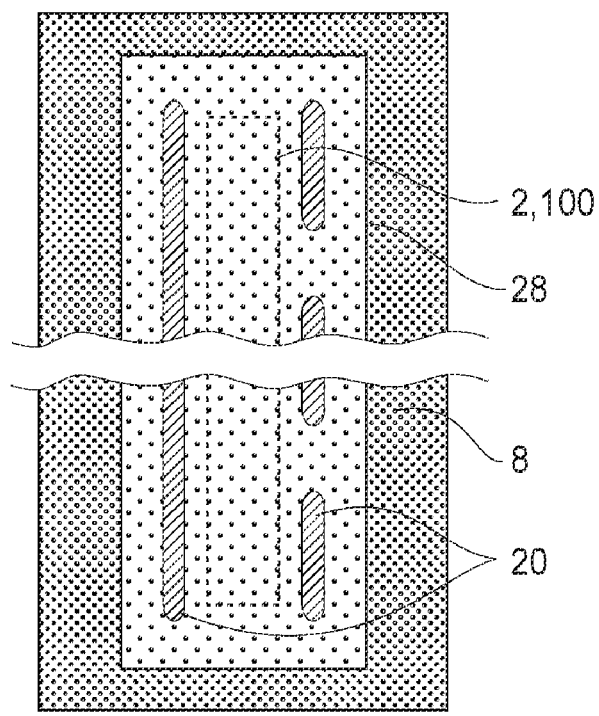
FIG. 15 shows a further example of a pilot hole.

As regards the formed pilot hole, there are other examples shown in FIGS. 14 and 15. In FIG. 14 example, the interval of the pilot holes in one of the two rows formed along the longitudinal direction of the opening of the masking layer, is smaller than that in the other row. With such a structure, the anisotropic etching in the large interval part becomes closer to that in the smaller interval part. As a result, the number of the pilot holes can be substantially decreased, and therefore, the productivity is improved. In FIG. 15 example, the pilot holes arranged in two rows in the longitudinal direction of the opening in the masking layer are in connection with are partly (FIG. 15(a)) or entirely (FIG. 15(b)) with the pilot holes in the same row into a channel shape. This structure can be provided by continuous scanning with a laser beam. This example is advantageous in that the depths of the unpenetrated holes from the back side of the substrate are uniform over the unpenetrated holes.

In this embodiment, a beam of frequency-tripled (THG: 355 nm in wavelength) laser light emitted by a YAG laser was used to process the substrate 1 to form the pilot holes 20. However, the beam of laser light used for processing the substrate 1 does not need to be limited to the above-mentioned one, as long as the wavelength of the laser light is suitable for forming holes through silicon, or the material for the substrate 1. For example, a beam of frequency-doubled (SHG: 532 nm in wavelength) laser light emitted by a YAG laser, which is as high in the absorbency by silicon as THG, may be used form the pilot holes 20.

Referring to FIG. 5b, (c), the silicon dioxide film 6 in the hole 28 (FIG. 6) on the bottom side of the substrate 1 is removed to expose the surface of the silicon substrate 1, at which the anisotropic etching of the substrate 1 is started. Then, the formation of the common ink delivery channel 16 is started. More specifically, the portions of the silicon dioxide film 6 on the bottom surface of the substrate 1, which are exposed through the holes 28, are removed, with the polyether-amide resin layer 8 used as a mask. Thereafter, the common ink delivery channels 16 which will reach sacrificial layer 2, one for one, are formed by etching the silicon substrate 1 from the bottom side, using THAH as anisotropic etchant. In this etching step, the etching front advances through the stages described with reference to FIG. 3, and the resultant <111> surfaces, the angles of which are 54.7°, reach the sacrificial layer 2. Then, the sacrificial layer 2 is isotropically etched by the etching fluid, effecting the top portion of the common ink delivery channel 16, which reflects the shape of the sacrificial layer 2. The cross section of the common ink delivery channel 16 at the line A-A in FIG. 1, which is contoured by the <111> surfaces, is "< >"-shaped.

Lastly, referring to FIG. 5b, (h), the portion of the etching stop layer 4, which is covering the top opening of the common ink delivery channel 16, is removed by dry etching. Then, the polyether-amide layer 8 and protective layer 15 are removed. Further, the positive resist layer 10 is dissolved out through the ink jetting hole 14 and common ink delivery channel 16 to effect the ink passages and bubble generation chambers.

Each ink jet recording head chip, or the substrate 1 having the nozzle portion, is completed through the above described manufacturing steps. Then, the silicon wafer is separated into individual ink jet recording head chips with the use of a dicing saw or the like. Then, wiring for driving the ink jetting energy generating element 3 is attached to each chip, and an ink container for an ink jet recording head chip is connected to each chip, completing an ink jet recording head.

Incidentally, in this embodiment, a silicon wafer which is 600 µm in thickness was used as the material for the substrate 1 for the ink jet recording head chip. However, the present invention is also applicable to an ink jet recording head chip manufacturing method which uses a silicon wafer or the like, which is thinner or thicker than the silicon wafer used in this embodiment. When such a material is used as the substrate, the depth of the pilot hole 20 and the dimension of the hole 28 should be changed to the values which satisfy Expressions (1) and (2).

Further, the common ink delivery channel 16 can be formed by carrying out multiple times the sequential steps shown in FIGS. 5B(F)-5B(H), instead of using the common ink delivery channel forming method in this embodiment. More specifically, a single row of pilot holes 20 which do not reach the sacrificial layer, are formed, and the substrate 1 is anisotropically etched using this row of pilot holes 20. Then, the next row of pilot holes 20 is formed next to the groove (cavity) formed using the first row of pilot holes, and then, the substrate 1 is anisotropically etched to complete the common ink delivery channel 16. In this case, when forming the pilot hole 20 so that it reaches the sacrificial layer, Expression (1) must be satisfied.

Embodiment 2

Figure 7:
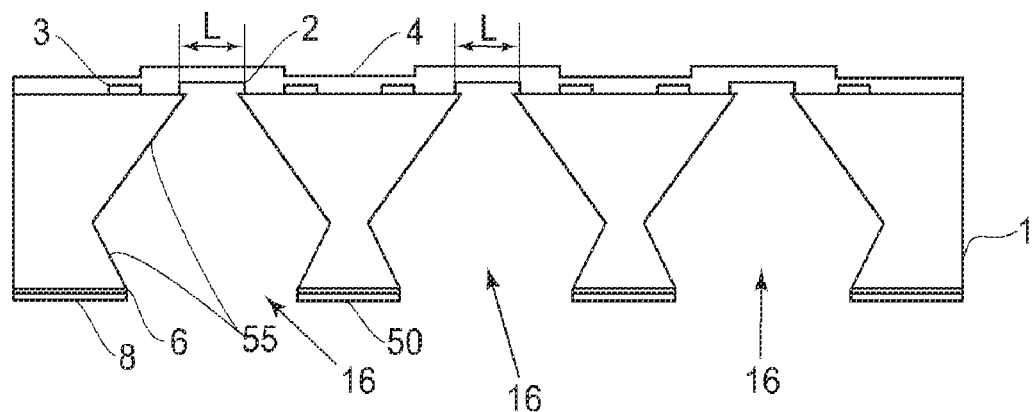
FIG. 7 is a sectional view of the ink jet recording head chip, in the second embodiment of the present invention.

FIG. 7 is a sectional view of the ink jet recording head chip in the second embodiment of the present invention.

The ink jet recording head chip in this embodiment is provided with multiple common ink delivery channels, which were formed in parallel with the use of the manufacturing method in the first embodiment described above. Thus, each common ink delivery channel 16 of the ink jet recording head chip in this embodiment also has the "< >"-shaped cross section.

Figure 8:
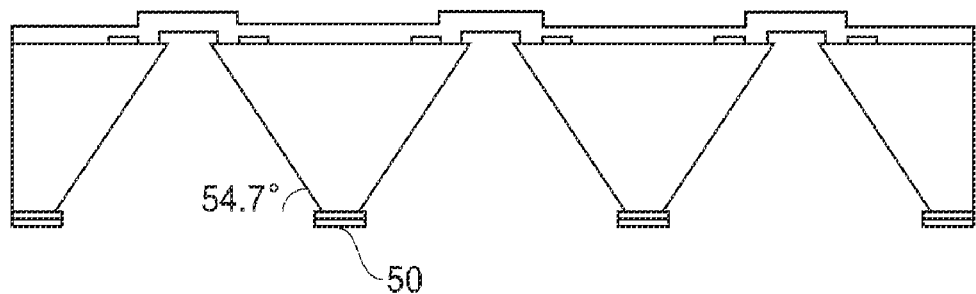
FIG. 8 is a sectional view of an ink jet recording head chip, which was formed using a manufacturing method in accordance with the prior art, which does not form the pilot holes.

FIG. 8 is a sectional view of an ink jet recording head chip formed with the use of an ink jet head manufacturing method in accordance with the prior art, which does not use pilot holes to form the common ink delivery channels. As will be evident from the comparison between FIGS. 7 and 8, the ink jet recording head chip manufacturing method in this embodiment used for forming the ink jet recording head chip shown in FIG. 7, makes it possible to form the common ink delivery channel 16, the width of which on the bottom side is smaller than that of the common ink delivery channel 16, shown in FIG. 8, formed with the use of an ink jet recording head chip manufacturing method in accordance with the prior art. Thus, the ink jet recording head chip manufacturing method in this embodiment can produce an ink jet recording head chip, in which the distance between the adjacent two common ink delivery channels 16 is smaller than that in an ink jet recording head chip formed with the use of the ink jet recording head chip manufacturing method in accordance with the prior art. Therefore, it can produce an ink jet recording head chip, which is smaller than the one produced with the use of the ink jet manufacturing method in accordance with the prior art. Further, the common ink delivery channels 16 in this embodiment have the "<>"-shaped cross section, making it possible to produce an ink jet recording head chip, in which the width of the surface area 50, by which the adjacent two common ink delivery channels 16, which are different in the color of the inks therein, is separated, is much wider, being therefore capable of better preventing the inks in the adjacent common ink delivery channels 16 from mixing, than that in an ink jet recording head chip produced with the use of an ink jet head manufacturing method in accordance with the prior art.

Also in the case of the ink jet recording head chip manufacturing method in this embodiment, the pattern in which the pilot holes 20 are formed, the depth of each pilot hole 20, the width of each hole of the bottom surface mask 8, may be changed to form various kinds of common ink delivery channels 16 having the "<>"-shaped cross section, for example, a common ink delivery channel 16, the bottom opening of which is greater than the top opening thereof, and the apex of its "<>"-shaped cross section is closer to the bottom surface of the substrate 1, as well as, a common ink delivery channel 16, the bottom opening of which is smaller than the top opening thereof, and the apex of its "< >"-shaped cross section is near the middle of the substrate 1 in terms of the thickness direction of the substrate 1.

As described above, in the case of an ink jet recording head chip having multiple common ink delivery channels 16 which are in the substrate 1 of the chip, the position (in terms of thickness direction of substrate 1) of the apex of the "< >"-shaped cross section of each common ink delivery channel 16 can be changed by satisfying the inequalities: Y1>Y2, or Y1<Y2, in which Y1 and Y2 (FIG. 9) are the widths of the holes of the bottom surface mask 8, which correspond to the bottom openings of the adjacent two common ink delivery channels 16, and can be obtained from the abovementioned Expression (2):

$$(T/\tan 54.7°) \times 2 + L \geq Y \tag{2}$$

Figure 9:
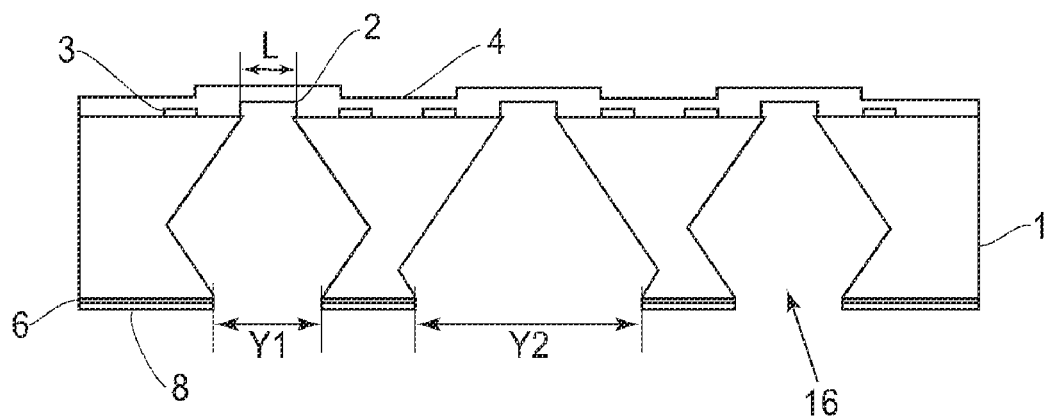
FIG. 9 is a sectional view of an ink jet recording head chip, the substrate of which has multiple common ink delivery channels which are different in the position of the apex in their vertical cross sections.

An ink jet recording head chip, which has multiple common ink delivery channels 16 arranged in parallel can be further reduced in size by differentiating the adjacent two common ink delivery channels 16 in the position of the apexes of their "<>"-shaped cross sections. FIG. 9 is a cross sectional view of an ink jet recording head chip structured as described above. As will be evident from FIG. 9, by differentiating the adjacent two common ink delivery channels 16 in the position of the apexes of their "< >"-shaped cross sections, the two common ink delivery channels 16 can be placed closer so that the apexes of the "< >"-shaped cross sections of the two common ink delivery channels 16 virtually overlap, making it possible to further reduce in size an ink jet recording head chip, compared to an ink jet recording head chip structured as shown in FIG. 7. In the case of the structural arrangement shown in FIG. 9, the distance between the apexes of the "<>"-shaped cross sections of the adjacent two common ink delivery channels 16 is greater than that shown in FIG. 7. Therefore, the portion 50 of the chip, which separates the adjacent two common ink delivery channels 16 different in the color of the ink therein, can be increased in strength.

Next, referring to FIGS. 10A and 10B, the manufacturing method for the ink jet recording head which includes the ink jet recording head chip shown in FIG. 9 will be described. Incidentally, the preferred embodiments of the present invention are not intended to limit the present invention in scope. That is, the present invention is also applicable to the technologies other than those in the preferred embodiment, as long as the technologies are compatible with the concept of the present invention stated in the claim section of this patent application.

Figure 10A:
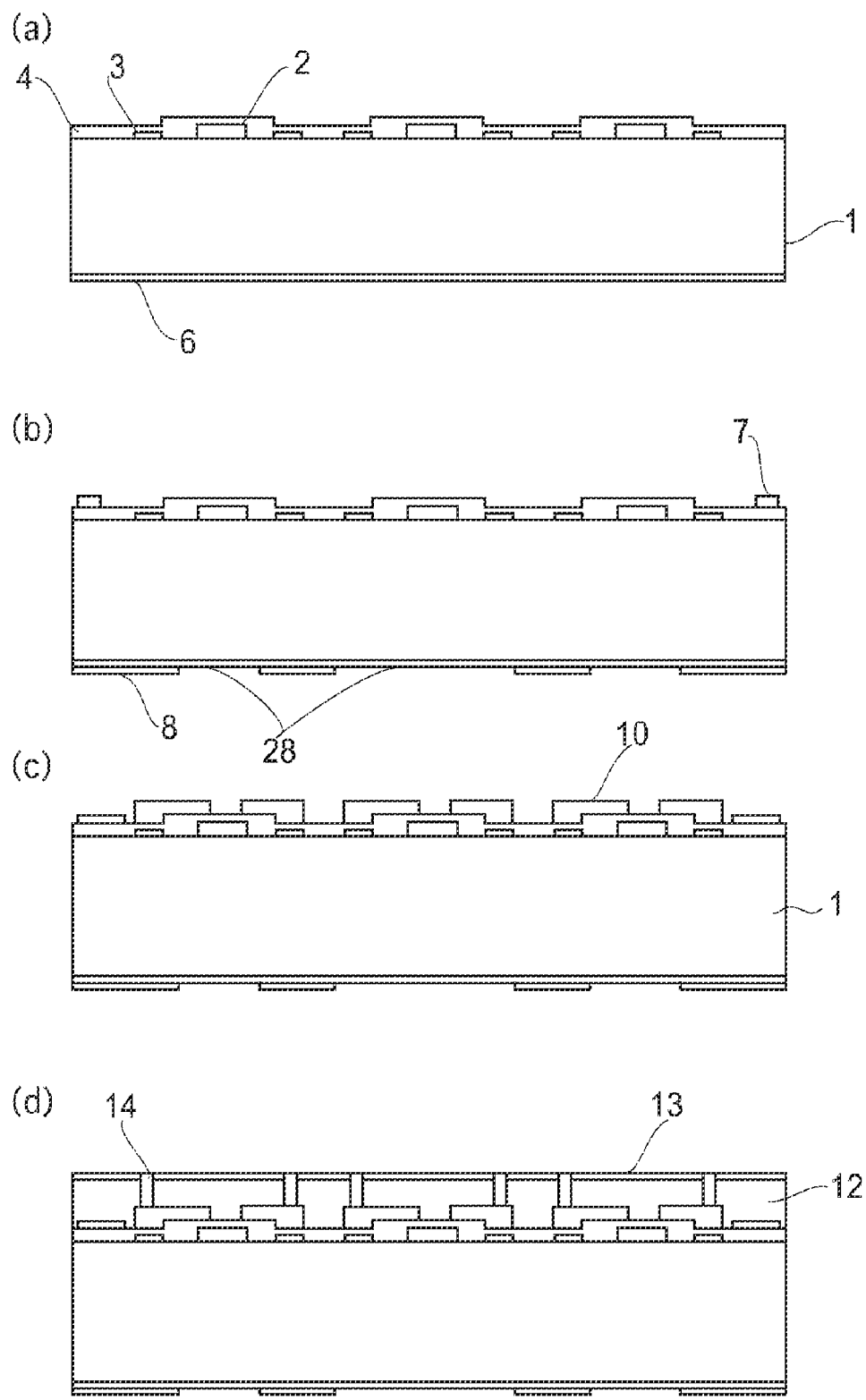
FIG. 10a is a schematic drawing showing Steps (a)-(d) in the ink jet recording head chip manufacturing method in the second embodiment of the present invention, which is for producing the ink jet recording head chip shown in FIG. 9.

The ink jet recording head chip, which is shown in FIG. 10a, (a), is provided with multiple ink jetting energy generation elements 3, such as heat generating resistors, which are on the top surface of the substrate 1. The entirety of the bottom surface of the substrate 1 is covered with a silicon dioxide film 6. There are also multiple strips of sacrificial layer 2 on the top surface of the substrate 1. Each strip of sacrificial layer 2 is dissolved away with alkaline solvent when forming the common ink delivery channel 16. The wiring for the energy generation elements 3 and the semiconductors for driving the heaters are not shown. The sacrificial layer 2 is formed of such a substance as polysilicon, aluminum (which can be quickly etched), aluminum-silicon, aluminum-copper, and aluminum-silicon-copper, which can be etched with alkaline solvent. The etching stop layer 4 must be capable of preventing the substrate 1 from being further etched by alkaline solvent, once the sacrificial layer 2 is exposed during the anisotropic etching of the substrate 1. It is preferred that the etching stop layer 4 is formed of silicon dioxide, which is also used as the material for the heat storage layer placed on the back surface side of the heater 3, silicon nitride, which is also used as the material for the protective layer placed on the energy generating element 3, or the like.

Next, referring to FIG. 10a, (b), polyether-amide resins (7) and (8) are coated on the top and bottom sides of the substrate 1, respectively, and are hardened by baking. Then, in order to pattern the polyether-amide resin layer 7, the positive resist (unshown) is spin coated on the top surface of the polyether-amide resin layer 7, is exposed in a preset pattern, and is developed. Then, the polyether-amide resin layer 7 is etched in the preset pattern by dry etching or the like method. Then, the positive resist is removed. Similarly, in order to pattern the polyether-amide resin layer 8, positive resist (unshown) is coated on the polyether-amide resin layer 8 on the bottom surface of the substrate 1, is exposed in a preset pattern, and is developed. Then, the polyether-amide resin layer 8 is etched by dry etching or the like method in the preset pattern. Then, the positive resist is removed.

Figure 11:
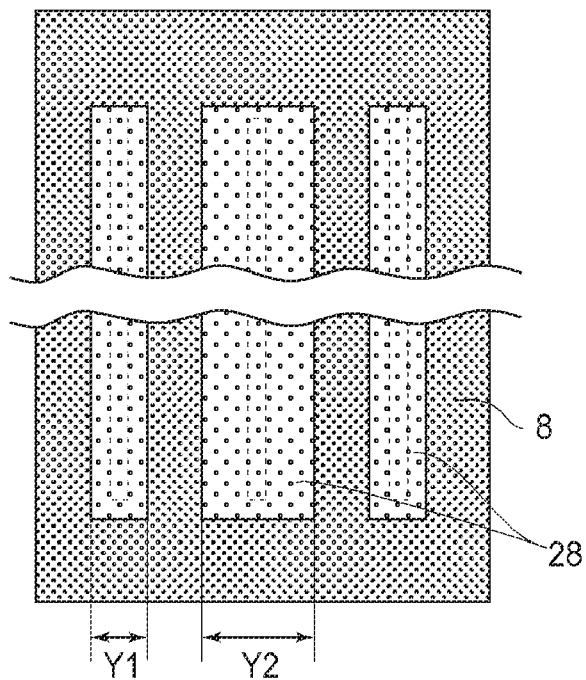
FIG. 11 is a plan view of the back side of the precursor of the ink jet recording head chip shown in FIG. 10a(b).

The width of the opening of the hole in the bottom surface mask 8 patterned on the bottom surface of the substrate 1 equals the width of the bottom opening of the common ink delivery channel 16. Therefore, the width of the opening of the hole in the bottom surface mask 8 is set so that it equals the intended width of the bottom opening of the common ink delivery channel 16. FIG. 11 is a bottom plan view of the precursor of the ink jet recording head chip, which is shown in FIG. 10a, (b). In this embodiment, the measurement Y1 of the opening of the larger hole in the bottom surface mask 8, in terms of the width direction of the substrate 1, is 800 μm, and the measurement Y2 of the opening of the smaller hole in the bottom surface mask 8, in terms of the width direction of the substrate 1, is 400 μm.

Next, referring to FIG. 10a, (c), positive resist 10 which is to be removed to form an ink passage is placed in the pattern of the ink passage.

Referring to FIG. 10a, (d), photosensitive resin 12 as the material for forming nozzles is coated by spin coating or the like method on the top side of the substrate 1 in a manner to cover the positive resist 10. Then, a water repellant dry film 13 is placed on the photosensitive resin layer 12 by lamination or the like method. Then, the photosensitive resin layer 12 is patterned. That is, it is exposed in a preset pattern, with the use of ultraviolet rays, deep ultraviolet rays, or the like, and is developed, forming an ink jetting holes 14 through the photosensitive resin layer 12.

Figure 10B:
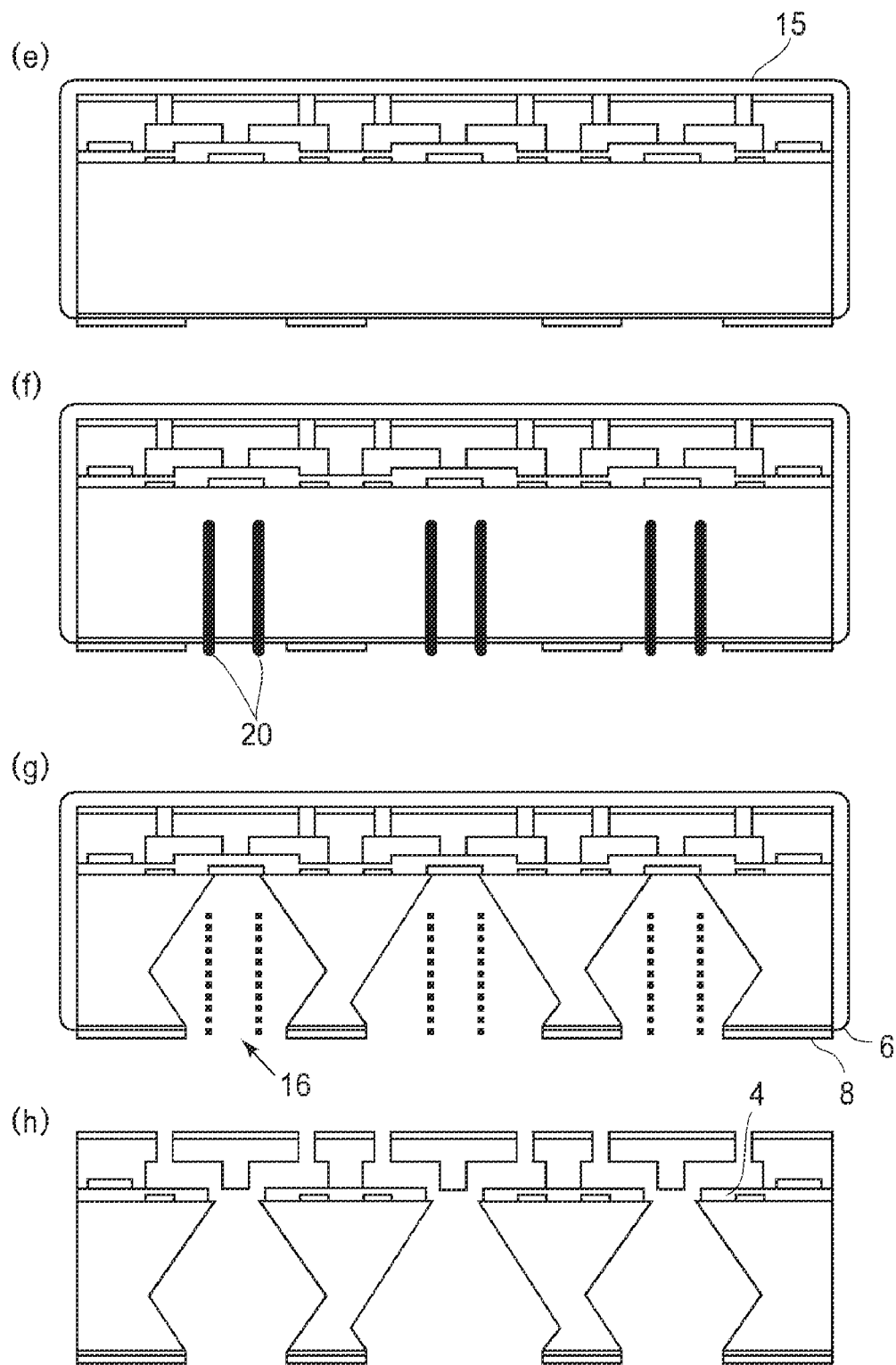
FIG. 10b is a schematic drawing showing Steps (e)-(h) in the ink jet recording head chip manufacturing method, which is for producing the ink jet recording head chip shown in FIG. 9.

Referring to FIG. 10*b*, (e), the top side of the substrate 1, on which the positive resist 10, photosensitive resin layer 12, etc., are present, and the lateral surfaces of the substrate 1, are coated with a protective layer 15 by spin coating or the like method.

Referring to FIG. 10*b*, (f), the pilot holes 20 are formed with the use of a laser, from the bottom side of the substrate 1 toward the top side. In this step, two straight rows of pilot holes 20 are formed per common ink delivery channel 16 so that the two rows are symmetrically positioned with reference to the center of the sacrificial layer 2. As the means for forming the pilot holes 20, a beam of frequency-tripled (THG: 355 nm in wavelength) laser light emitted by a YAG laser. The power and frequency of the laser was set to optimum values. In this embodiment, the diameter of the pilot hole 20 is roughly 40 µm. The diameter of the pilot hole 20 is desired to be in a range of roughly 5-100 µm. If it is excessively small, it is difficult for the etchant to enter the pilot hole 20 during the subsequent step in which the substrate 1 is anisotropically etched. On the other hand, if the diameter of the pilot hole 20 is excessively large, it takes an excessive length of time to form the pilot hole 20 with the desired depth. Incidentally, if it is necessary to increase the diameter of the pilot hole 20, the pitch with which the pilot holes 20 are formed must be set so that the adjacent two pilot holes 20 do not overlap. Incidentally, an ink jet recording head chip, the multiple common ink delivery channels 16 of which are the same in the width of their top openings, can be produced by keeping constant the conditions under which the substrate 1 is processed to form the pilot holes 20.

Figure 12:
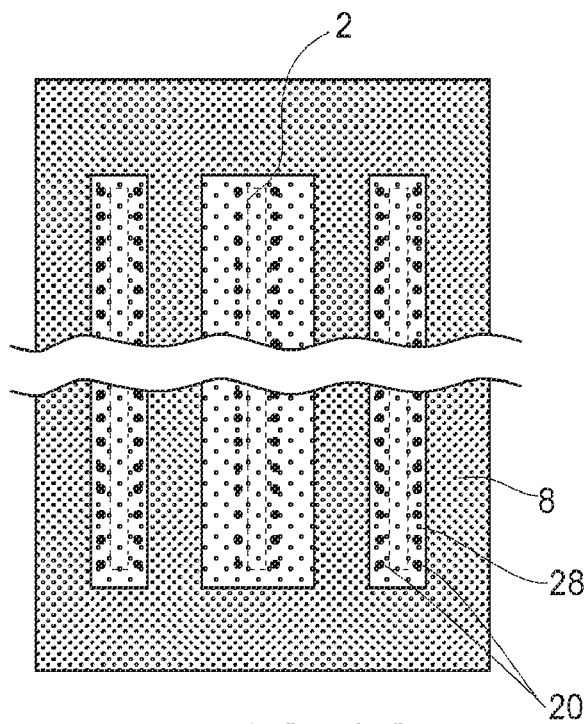
FIG. 12 is a plan view of the back side of the precursor of the ink jet recording head chip, shown in FIG. 10b(f), which shows the pilot holes formed in Step (f) of the manufacturing method, shown in FIG. 10b.

FIG. 12 is a plan view of the bottom side of the substrate 1 after the formation of the pilot holes 20 in the step shown in FIG. 10*b*, (f). The polyether-amide layer 8 (bottom surface mask) on the bottom surface of the substrate 1 has the holes 28, the positions of which correspond to those of the intended ink opening position (the sacrificial layers 2 in the case of the provision of the sacrificial layer) (contoured by dotted lines in FIG. 12) on the top surface of the substrate 1. These holes 28 are formed in the step shown in FIG. 10*a*, (b), and the polyether-amide layer 8 functions as the mask used for anisotropically etching the substrate 1.

Incidentally, in this embodiment, the pilot holes 20 were formed with the use of the frequency-tripled (THG: 355 nm in wavelength) beam of laser light emitted by a YAG laser. However, the selection of the beam of laser light used for processing the substrate 1 to form the pilot holes 20 does not need to be limited to the one used in this embodiment, as long as the selected laser light can form a hole through silicon, or the material for the substrate 1. For example, a beam of frequency-doubled (SHG: 532 nm in wavelength) laser light emitted by a YAG laser, which is as high in the absorbency by silicon as THG, may be used to form the pilot holes 20.

Next, referring to FIG. 10*b*, (g), the portions of the silicon dioxide film 6 in the holes 28 (FIG. 12) on the bottom surface of the substrate 1 are removed to expose the surface of the silicon substrate 1, at which the anisotropic etching of the substrate 1 is to be started. Then, the formation of the common ink delivery channels 16 is started. More specifically, the portions of the silicon dioxide film 6 on the bottom surface of the substrate 1, which are exposed through the holes 28, are removed, with the polyether-amide resin layer 8 used as a mask. Thereafter, the common ink delivery channels 16 are formed by etching the silicon substrate 1 from the bottom side, using THAH as anisotropic etchant so that the common ink delivery channels 16 reach sacrificial layers 2, one for one. In this etching step, the etching of the substrate 1 starts at the end of each pilot hole 20, and as the etching continues, and the resultant <111>surfaces, the angles of which relative to the bottom surface of the substrate 1 are 54.7° reach the sacrificial layer 2. Then, each of the sacrificial layers 2 is isotropically etched by the etching fluid, effecting the top portion of the common ink delivery channel 16, which reflects the shape of the sacrificial layer 2. Each common ink delivery channel 16 is formed so that its cross section, which is contoured by the <111>surfaces, is "<>"-shaped. In this embodiment, the positions of the apexes of the "< >"-shaped cross sections of the adjacent two common ink delivery channels 16 are separated by roughly 140 µm in terms of the thickness direction of the substrate 1.

Lastly, referring to FIG. 10*b*, (h), the portion of the etching stop layer 4, which is covering the top opening of the common ink delivery channel 16, is removed by dry etching. Then, the polyether-amide layer 8 and protective layer 15 are removed. Further, the positive resist layer 10 is dissolved out through the ink jetting hole 14 and common ink delivery channel 16 to effect the ink passages and bubble generation chambers.

The precursor of the ink jet recording head chip, or the substrate 1 having the nozzle portion, is completed through the above described manufacturing steps. Then, the silicon wafer is separated with the use of a dicing saw or the like, into individual ink jet recording head chips. Then, wiring for driving the ink jetting energy generating element 3 is attached to each ink jet recording head chip, and an ink container for an ink jet recording head chip is connected to each chip, completing an ink jet recording head.

Incidentally, in this embodiment, a silicon wafer which is 600 µm in thickness was used to manufacture the ink jet recording head chips. However, the present invention is also applicable to an ink jet recording head chip manufacturing method which uses a silicon wafer or the like, which is thinner or thicker than the silicon wafer used in this embodiment. When such a silicon wafer or the like is used, the depth of the pilot hole 20 and the dimension of the hole 28 should be changed to the values which satisfy Expressions (1) and (2).

Described above is an example of the common ink delivery channel forming method, in which the position (in terms of thickness direction of substrate) of the apexes of the "<>"-shaped cross section of the common ink delivery channel, is changed by changing the dimension (in terms of width direction of substrate) of the opening of the hole in the bottom surface mask 8.

While the invention has been described with reference to the structures disclosed herein, it is not confined to the details set forth, and this application is intended to cover such modifications or changes as may come within the purposes of the improvements or the scope of the following claims.

This application claims priority from Japanese Patent Application No. 061166/2006 filed Mar. 7, 2006 which are hereby incorporated by reference.

What is claimed is:
1. An ink jet head comprising:
a silicon substrate on a front side of which an energy generating element is provided for generating energy for ejecting ink and in which a plurality of ink supply ports for supplying the ink to said energy generating element is provided;
ink ejection outlets; and
a flow path formation member for forming ink flow paths for communicating said ink ejection outlets and said ink supply ports with each other, wherein said ink supply ports have such a cross-sectional shape that a width of each of said ink supply ports, measured in a direction parallel with the front side, increases to a position of a predetermined depth from an opening of each of said ink supply ports at a back side of said silicon substrate and then decreases toward the front side of said silicon substrate, so that at the position of the predetermined depth, said ink supply port has a maximum width, and wherein the predetermined depths of adjacent ink supply ports are different from each other.

2. The ink jet head according to claim 1, wherein the ink supply ports are formed by anisotropic etching to the recesses formed in said silicon substrate.

3. The ink jet head according to claim 2, wherein said recesses are formed by laser.

* * * * *